(12) United States Patent
Jin (10) Patent No.: US 8,400,861 B2
(45) Date of Patent: Mar. 19, 2013

(54) POWER SUPPLY CONTROL CIRCUIT AND SEMICONDUCTOR APPARATUS INCLUDING THE SAME

(75) Inventor: Sin Hyun Jin, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 320 days.

(21) Appl. No.: 12/841,086

(22) Filed: Jul. 21, 2010

(65) Prior Publication Data

US 2011/0235456 A1     Sep. 29, 2011

(30) Foreign Application Priority Data

Mar. 29, 2010   (KR) .................... 10-2010-0027821

(51) Int. Cl.
 *G11C 5/14*     (2006.01)
(52) U.S. Cl. ................ 365/227; 365/226; 365/230.03; 365/51
(58) Field of Classification Search ............... 365/226, 365/227, 230.03, 51
 See application file for complete search history.

(56) References Cited

U.S. PATENT DOCUMENTS

| | | | |
|---|---|---|---|
| 7,391,238 B2 | 6/2008 | Kim et al. | |
| 7,500,050 B2 | 3/2009 | Gill et al. | |
| 7,543,102 B2 | 6/2009 | Jacob et al. | |
| 8,031,505 B2 * | 10/2011 | Kang et al. | 365/51 |
| 2003/0231543 A1 * | 12/2003 | Matsui | 365/233 |
| 2004/0257890 A1 * | 12/2004 | Lee et al. | 365/200 |
| 2005/0099834 A1 * | 5/2005 | Funaba et al. | 365/63 |
| 2007/0064462 A1 * | 3/2007 | Matsui | 365/63 |
| 2007/0140040 A1 * | 6/2007 | Aoki et al. | 365/233 |
| 2007/0230230 A1 * | 10/2007 | Hofstra | 365/51 |
| 2008/0229029 A1 * | 9/2008 | Kang | 711/149 |
| 2009/0032928 A1 | 2/2009 | Chiang et al. | |
| 2009/0091962 A1 * | 4/2009 | Chung et al. | 365/51 |
| 2009/0103345 A1 * | 4/2009 | McLaren et al. | 365/64 |
| 2009/0166873 A1 | 7/2009 | Yang et al. | |
| 2009/0248994 A1 | 10/2009 | Zheng et al. | |
| 2010/0031075 A1 * | 2/2010 | Kapil | 713/340 |
| 2010/0138460 A1 * | 6/2010 | Ogasawara | 707/813 |
| 2011/0310649 A1 * | 12/2011 | Kang et al. | 365/51 |

FOREIGN PATENT DOCUMENTS

| | | |
|---|---|---|
| JP | 2006-040536 A | 9/2006 |
| JP | 2007-164599 | 6/2007 |
| KR | 10-1997-0029788 A | 6/1997 |
| KR | 100173953 B1 | 11/1998 |

* cited by examiner

*Primary Examiner* — Hoai V Ho
*Assistant Examiner* — Jay Radke
(74) *Attorney, Agent, or Firm* — William Park & Associates Ltd.

(57) ABSTRACT

A power supply control circuit includes a power supply control unit configured to receive a rank mode signal and generate a plurality of power supply enable signals based on a rank mode designated by the rank mode signal, a chip selection signals and bank address signals; and a plurality of power blocks configured to supply power to a plurality of memory banks of a plurality of chips based on the plurality of power supply enable signals.

20 Claims, 5 Drawing Sheets

POWER SUPPLY CONTROL CIRCUIT AND SEMICONDUCTOR APPARATUS INCLUDING THE SAME

CROSS-REFERENCES TO RELATED APPLICATION

The present application claims priority under 35 U.S.C. §119(a) to Korean Application No. 10-2010-0027821, filed on Mar. 29, 2010, in the Korean Intellectual Property Office, which is incorporated herein by reference in its entirety as if set forth in full.

BACKGROUND

1. Technical Field

The present invention relates to a semiconductor apparatus, and more particularly, to a power supply control circuit and a semiconductor apparatus including the same.

2. Related Art

A semiconductor apparatus, specifically, a memory has a plurality of memory banks to and from which data are inputted and outputted. The memory receives address signals for designating memory banks to and from which data are to be inputted and outputted. Accordingly, the memory banks designated by the address signals are to be activated. In order to activate the memory banks, appropriate power should be supplied to the memory banks. Accordingly, the memory has a power supply control circuit for supplying power to the memory banks designated by the address signals.

Figure 1:
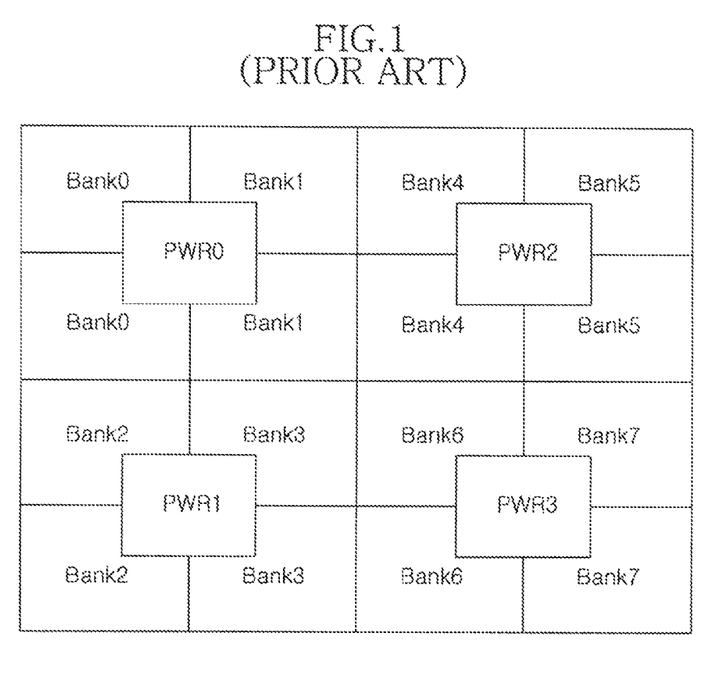
FIG. 1 is a diagram schematically illustrating a configuration of a conventional semiconductor apparatus.

FIG. 1 is a diagram schematically illustrating a configuration of a conventional semiconductor apparatus. Referring to FIG. 1, a conventional semiconductor apparatus includes first to eighth memory banks Bank0-Bank7, and first to fourth power blocks PWR0-PWR3. The first to eighth memory banks Bank0-Bank7 store data and output stored data, and the first to fourth power blocks PWR0-PWR3 supply power to the first to eighth memory banks Bank0-Bank7. In the conventional semiconductor apparatus, power supply control is implemented in a simple manner. Referring to FIG. 1, when the first memory bank Bank0 or the second memory bank Bank1 is to be activated, power is supplied through the first power block PWR0, and when the third memory bank Bank2 or the fourth memory bank Bank3 is to be activated, power is supplied through the second power block PWR1. In other words, the conventional semiconductor apparatus supplies power only to the memory banks to be activated through a power block in charge of them, thereby reducing power consumption.

Recently, a three-dimensional semiconductor apparatus, in which a plurality of chips are stacked and packaged into a single package, has been developed. The plurality of chips is electrically connected with one another through wires or through-silicon vias (TSVs) so as to operate as a single semiconductor apparatus. Since the three-dimensional semiconductor apparatus is actively developed, a method for efficiently supplying power in three-dimensional structure is demanded.

SUMMARY

Accordingly, various exemplary embodiments of the invention may provide a power supply control circuit which can efficiently supply power in a three-dimensional semiconductor apparatus, and a semiconductor apparatus including the same.

In one embodiment of the present invention, a power supply control circuit includes: a power supply control unit configured to receive a rank mode signal and generate a plurality of power supply enable signals based on a rank mode designated by the rank mode signal, a chip selection signals and bank address signals; and a plurality of power blocks configured to supply power to a plurality of memory banks of a plurality of chips based on the plurality of power supply enable signals.

In another embodiment of the present invention, a semiconductor apparatus includes a plurality of chips stacked vertically, wherein each chip has a first to a fourth memory bank region, and each bank region of each chip is placed over or under the respective bank region of the other chips such that each first to fourth bank region is in the same position in its respective plane, a power supply control circuit configured to supply power in common to two memory bank regions of each of the plurality of chips in response to bank address signals in a first rank mode, and to supply power in common to two memory bank regions of each of the plurality of chips in response to chip selection signals in a second rank mode.

In still another embodiment of the present invention, a semiconductor apparatus includes: a plurality of chips stacked vertically and having a plurality of memory bank regions placed at the same positions in a vertical direction; and a power supply control circuit configured to supply power to the plurality of memory bank regions of the plurality of chips based on the rank mode, chip selection signals and bank address signals, wherein the plurality of memory bank regions of the plurality of chips are assigned to different bank address signals based on the rank mode.

BRIEF DESCRIPTION OF THE DRAWINGS

Features, aspects, and embodiments are described in conjunction with the attached drawings, in which.

DETAILED DESCRIPTION

Reference will now be made in detail to the exemplary embodiments consistent with the present disclosure, examples of which are illustrated in the accompanying drawings. Whenever possible, the same reference numerals will be used throughout the drawings to refer to the same or like parts.

Figure 2:
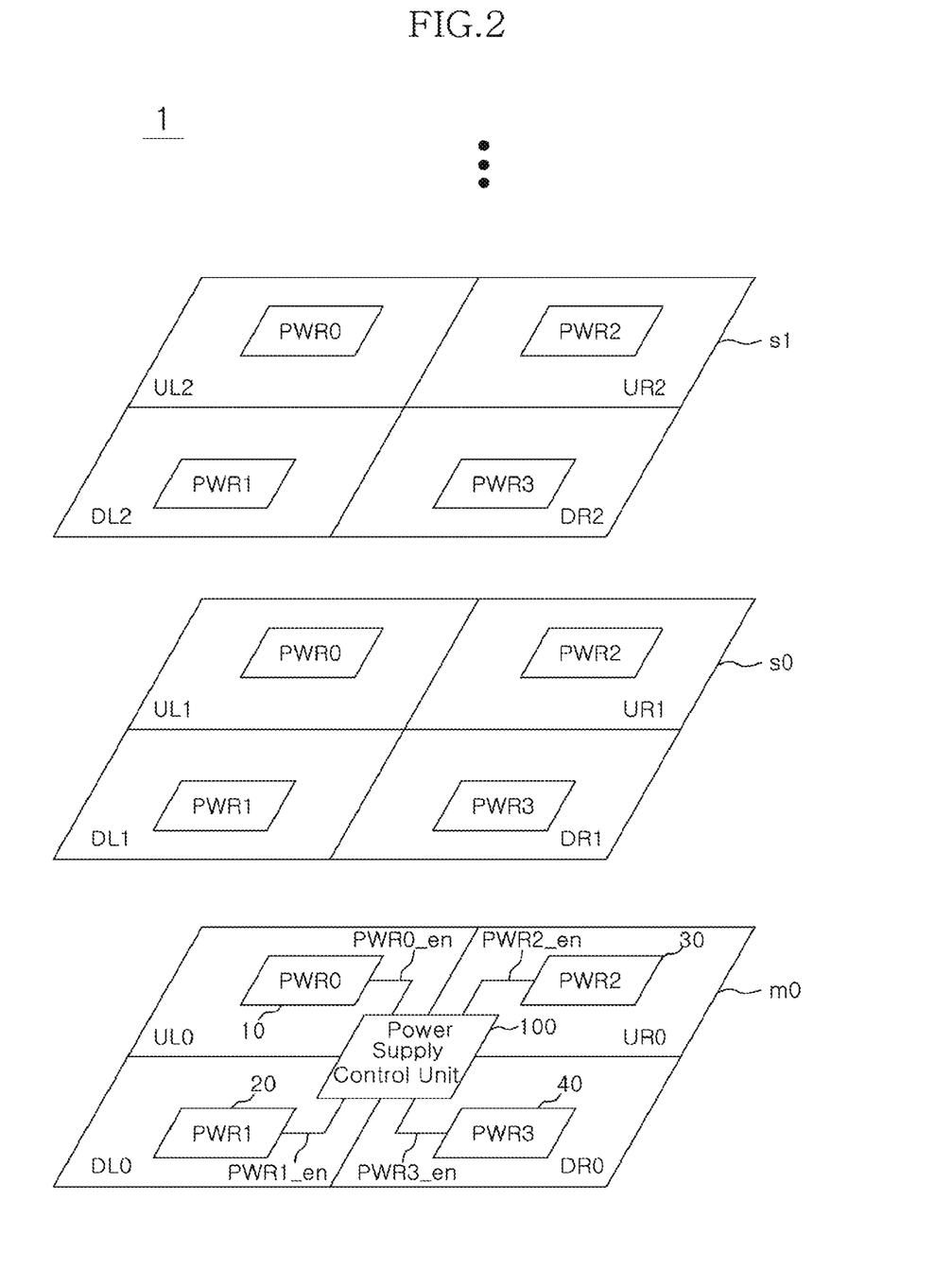
FIG. 2 is a diagram schematically illustrating a configuration of a semiconductor apparatus in accordance with an embodiment of the present invention.

FIG. 2 is a diagram schematically illustrating a configuration of a semiconductor apparatus in accordance with an embodiment of the present invention. Referring to FIG. 2, a semiconductor apparatus 1 may include a three-dimensional semiconductor apparatus in which three chips m0, s0 and s1 are stacked. However, the number of chips to be stacked is not limited, and more chips can be stacked. The first chip m0 may operate as a master chip, and the second and third chips s0 and s1 may operate as slave chips. Each of the first to third chips m0, s0 and s1, or each of the second and third chips s0 and s1 except the first chip m0, may have, but not limited to, four memory bank regions UL, DL, UR, and DR, wherein a pair of bank regions may be divided into eight memory banks 0-7.

In the semiconductor apparatus 1, the first to third chips m0, s0 and s1 are vertically stacked and constitute a single semiconductor apparatus. Accordingly, the memory bank regions UL0-UL2, DL0-DL2, UR0-UR2 and DR0-DR2 of the first to third chips m0, s0 and s1 are placed at the same positions in the vertical position. That is to say, the first memory bank regions UL1 and UL2 of the second and third chips s0 and s1 are each placed over the first memory bank region UL0 of the first chip m0 at the same position in their respective planes, and the second memory bank regions DL1 and DL2 of the second and third chips s0 and s1 are each placed over the second memory bank region DL0 of the first chip m0 at the same position in their respective planes. The third memory bank regions UR0-UR2 and the fourth memory bank regions DR0-0R2 are also each placed in the same manner respectively.

Referring to FIG. 2, the first chip m0 may include a power supply circuit. The first chip m0 supplies power to the memory banks of the first to third chips m0, s0 and s1 via the power supply circuit. Since the semiconductor apparatus 1 is a three-dimensional semiconductor apparatus in which a plurality of chips are stacked and is packaged into a single semiconductor apparatus, the power supplied through the power supply circuit of the first chip m0 can be supplied to the second and third chips s0 and s1 through electrical connection elements such as wires and through-silicon vias (TSVs). The power supply circuit may include a power supply control unit 100, and first to fourth power blocks PWR0-PWR3 designated by the reference numerals 10-40. The power supply control unit 100 generates power supply enable signals PWR0_en-PWR3_en for supplying power to memory banks which are to be activated among the memory banks of the first to third chips m0, s0 and s1. Please note that the illustration of PWR0-3 in second and third chips s0 and s1 are intended to express that the power generated in master chip m0 is transmitted to the slave chips s0 and s1 through TSV. The slave chips do not include first to fourth power blocks PWR0-3. The first to fourth power blocks 10-40 are respectively assigned to the first to fourth memory bank regions UL, DL, UR and DR and supply power to the first to third chips m0, s0 and s1. The power generated from the first to fourth power blocks 10-40 may be supplied in common to the first to third chips m0, s0 and s1 through wires or TSVs.

The power includes all internal voltages used in the input/output operations of the memory banks. One example of the internal voltages includes, but not limited to, a core voltage which is used when inputting/outputting data.

Figure 3:
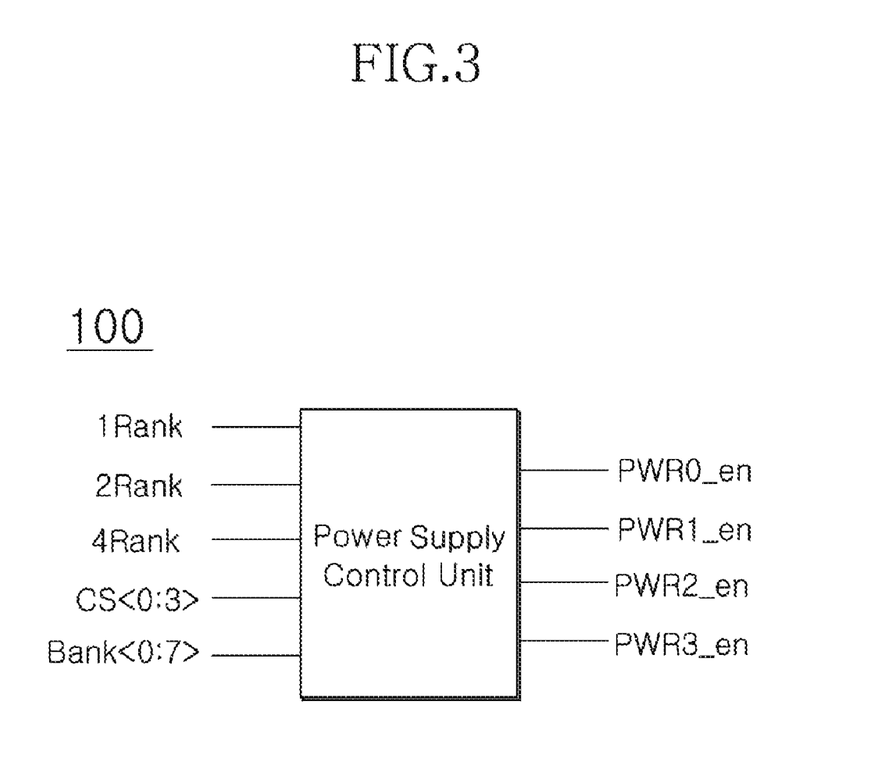
FIG. 3 is a block diagram illustrating input and output signals of the power supply control unit shown in FIG. 2.

FIG. 3 is a block diagram illustrating input and output signals of the power supply control unit shown in FIG. 2. Referring to FIG. 3, the power supply control unit 100 receives one or more rank mode signals, and generates the power supply enable signals PWR0_en-PWR3_en based on the rank mode designated by the rank mode signals, chip selection signals CS<0:3> and bank address is signals Bank<0:7>. Based on the rank mode, a single semiconductor apparatus may be divided into a plurality of ranks so as to operate as one or more ranks. The rank mode may comprise a first rank mode, a second rank mode, and a third rank mode. In the first rank mode, the semiconductor apparatus operates as one rank. In the second rank mode, the semiconductor apparatus operates as two ranks. In the third rank mode, the semiconductor apparatus operates as four ranks. The rank mode may be determined by rank mode signals 1Rank, 2Rank and 4Rank which are generated from a mode register set (MRS) provided in the semiconductor apparatus.

The chip selection signals CS<0:3> may be command signals inputted through pads from the outside, and are used as signals for activating ranks which will actually operate in the semiconductor apparatus operating as a plurality of ranks as described above. Accordingly, one chip select signal CS<0> can be used in a 1Rank mode, two chip selection signals CS<0:1> can be used in a 2Rank mode, and four chip selection signals CS<0:3> can be used in a 4Rank mode two chip selection.

The bank address signals Bank<0:7> are signals for designating memory banks to be activated, and are generated from the address signals inputted through the pads.

Figure 4:
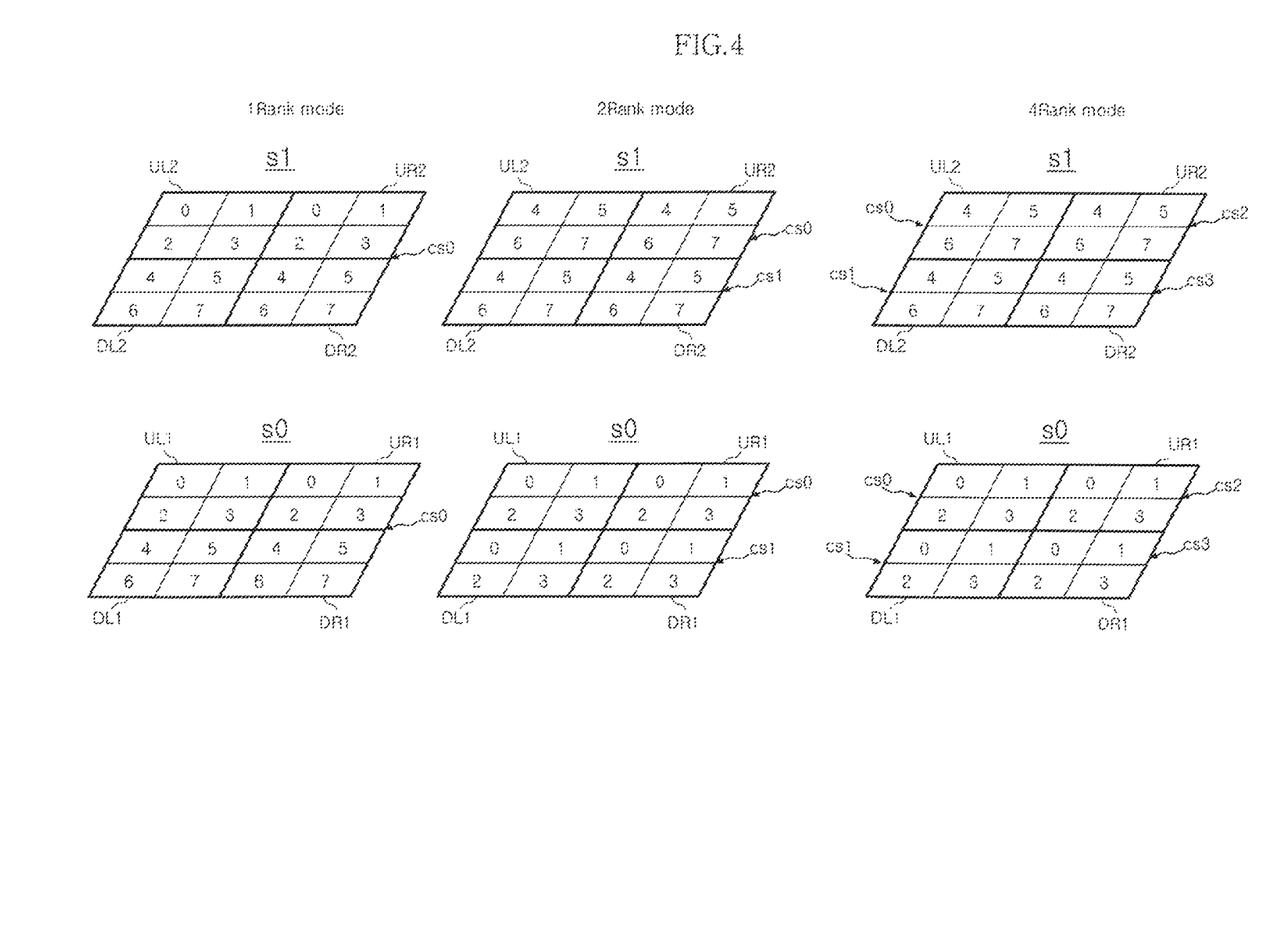
FIG. 4 is a diagram illustrating an exemplary assignment of chip selection signals and bank address signals to memory banks of a plurality of chips in the semiconductor apparatus in accordance with an embodiment of the present invention.

FIG. 4 is a diagram illustrating an exemplary assignment of chip selection signals and bank address signals to memory banks of the semiconductor apparatus. FIG. 4 illustrates the assignment of signals when the semiconductor apparatus 1 operates in the first rank mode '1Rank mode', the second rank mode '2Rank mode', and the third rank mode '4Rank mode', respectively. First, in the first rank mode '1Rank mode', since the semiconductor apparatus 1 operates as one rank, one chip selection signal CS<0> is used. The first to fourth bank address signals Bank<0:3> (only Arabic numerals are shown in FIG. 4 for the sake of convenience) are assigned to the first memory bank regions UL1 and UL2 and the third memory bank regions UR1 and UR2, and the fifth to eighth bank address signals Bank<4:7> are assigned to the second memory bank regions DL1 and DL2 and the fourth memory bank regions DR1 and DR2.

In the second rank mode '2Rank mode', since the semiconductor apparatus 1 operates as two ranks, two chip selection signals CS<0:1> are used. Accordingly, the first chip selection signal CS<0> is assigned to the first memory bank regions UL1 and UL2 and the third memory bank regions UR1 and UR2 as a first rank, and the second chip selection signal CS<1> is assigned to the second memory bank regions DL1 and DL2 and the fourth memory bank regions DR1 and DR2 as a second rank. Also, the first to fourth bank address signals Bank<0:3> are assigned to the first to fourth memory bank regions UL1, DL1, UR1 and DR1 of the lower chip, and the fifth to eighth bank address signals Bank<4:7> are assigned to the first to fourth memory bank regions UL2, DL2, UR2 and DR2 of the upper chip.

In the third rank mode '4Rank mode', since the semiconductor apparatus 1 operates as four ranks, four chip selection signals CS<0:3> are used. The first chip selection signal CS<0> is is assigned to the first memory bank regions UL1 and UL2 as a first rank, the second chip selection signal CS<1> is assigned to the second memory bank regions DL1 and DL2 as a second rank, the third chip selection signal CS<2> is assigned to the third memory bank regions UR1 and UR2 as a third rank, and the fourth chip selection signal CS<3> is assigned to the fourth memory bank regions LR1 and LR2 as a fourth rank. Further, the first to fourth bank address signals Bank<0:3> are assigned to the first to fourth memory bank regions UL1, DL1, UR1 and DR1 of the lower chip, and the fifth to eighth bank address signals Bank<4:7> are assigned to the first to fourth memory bank regions UL2, DL2, UR2 and DR2 of the upper chip.

This is given in Table 1.

TABLE 1

| Mode | 1Rank mode | | 2Rank mode | | 4Rank mode | |
|---|---|---|---|---|---|---|
| | Bank address assign | Chip selection signal assign | Bank address assign | Chip selection signal assign | Bank address assign | Chip selection signal assign |
| UL2 | 0-3 | 0 | 4-7 | 0 | 4-7 | 0 |
| UR2 | 0-3 | 0 | 4-7 | 0 | 4-7 | 2 |
| DL2 | 4-7 | 0 | 4-7 | 1 | 4-7 | 1 |
| DR2 | 4-7 | 0 | 4-7 | 1 | 4-7 | 3 |

TABLE 1-continued

| | 1Rank mode | | 2Rank mode | | 4Rank mode | |
|---|---|---|---|---|---|---|
| Mode | Bank address assign | Chip selection signal assign | Bank address assign | Chip selection signal assign | Bank address assign | Chip selection signal assign |
| UL1 | 0-3 | 0 | 0-3 | 0 | 0-3 | 0 |
| UR1 | 0-3 | 0 | 0-3 | 0 | 0-3 | 2 |
| DL1 | 4-7 | 0 | 0-3 | 1 | 0-3 | 1 |
| DR1 | 4-7 | 0 | 0-3 | 1 | 0-3 | 3 |

By assigning the chip selection signals CS<0:3> and the bank address signals Bank<0:7> to the memory banks of the stacked chips as described above, the semiconductor apparatus 1 may designate individual memory banks to be activated for operation based on the chip selection signals CS<0:3> and the bank address signals Bank<0:7>. The above-described signal assignment is only an example, and a person skilled in the art will readily appreciate that other signal assignments can be employed.

Figure 5:
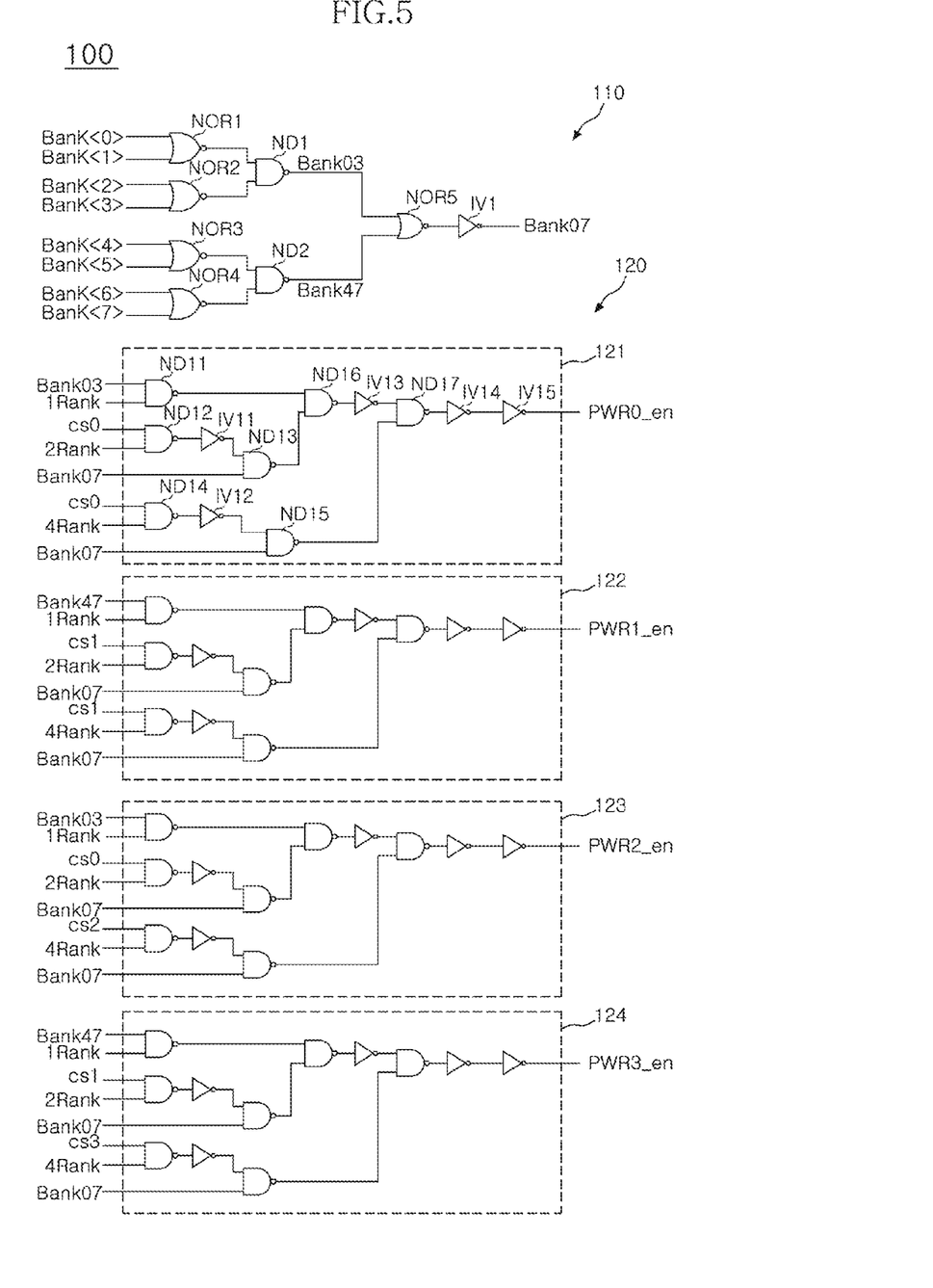
FIG. 5 is a diagram illustrating a detailed configuration of the power supply control unit shown in FIG. 3.

FIG. 5 is a diagram illustrating a detailed configuration of the power supply control unit shown in FIG. 3. Referring to FIG. 5, the power supply control unit 100 may include a signal combining section 110 and a power supply enable signal generating section 120.

The signal combining section 110 receives the first to eighth bank address signals Bank<0:7> and generates first to third combination signals Bank03, Bank47 and Bank07. The signal combining section 110 may include first to fifth NOR gates NOR1-NOR5, first and second NAND gates ND1 and ND2, and a first inverter IV1. The first NOR gate NOR1 receives the first and second bank address signals Bank<0:1>, the second NOR gate NOR2 receives the third and fourth bank address signals Bank<2:3>, the third NOR gate NOR3 receives the fifth and sixth bank address signals Bank<4:5>, and the fourth NOR gate NOR4 receives the seventh and eighth bank address signals Bank<6:7>. The first NAND gate ND1 receives the outputs of the first and second NOR gates NOR1 and NOR2, and the second NAND gate ND2 receives the outputs of the third and fourth NOR gates NOR3 and NOR4. The output of the first NAND gate ND1 becomes the first combination signal Bank03, and the output of the second NAND gate ND2 becomes the second combination signal Bank47. The fifth NOR gate NOR5 receives the first and second combination is signals Bank03 and Bank47, and the first inverter IV1 generates the third combination signal Bank07 by inverting the output of the fifth NOR gate NOR5. Accordingly, the signal combining section 110 enables the first and third combination signals Bank03 and Bank07 when any one of the first to fourth bank address signals Bank<0:3> is enabled, and enables the second and third combination signals Bank47 and Bank07 when any one of the fifth to eighth bank address signals Bank<4:7> is enabled.

The power supply enable signal generating section 120 generates the first to fourth power supply enable signals PWR0_en-PWR3_en in response to the first to third combination signals Bank03, Bank47 and Bank07, the first, second and third rank mode signals 1Rank, 2Rank and 4Rank, and the first to fourth chip selection signals CS<0:3>. The power supply enable signal generating section 120 may include first to fourth enable signal generating part 121-124. The first enable signal generating part 121 receives the first, second and third rank mode signals 1Rank, 2Rank and 4Rank, the first and third combination signals Bank03 and Bank07, and the first chip selection signal CS<0>, and generates the first power supply enable signal PWR0_en. The second enable signal generating part 122 receives the first, second and third rank mode signals 1Rank, 2Rank and 4Rank, the second and third combination signals Bank47 and Bank07, and the second chip selection signal CS<1>, and generates the second power supply enable signal PWR1_en. The third enable signal generating part 123 receives the first, second and third rank is mode signals 1Rank, 2Rank and 4Rank, the first and third combination signals Bank03 and Bank07, and the first and third chip selection signals CS<0> and CS<2>, and generates the third power supply enable signal PWR2_en. The fourth enable signal generating part 124 receives the first, second and third rank mode signals 1Rank, 2Rank and 4Rank, the second and third combination signals Bank47 and Bank07, and the second and fourth chip selection signals CS<1> and CS<3>, and generates the fourth power supply enable signal PWR3_en.

Each of the first to fourth enable signal generating parts 121-124 may include first to seventh NAND gates and first to fifth inverters. Describing the first enable signal generating part 121 for example, a first NAND gate ND11 receives the first combination signal Bank03 and the first rank mode signal 1Rank. A second NAND gate ND12 receives the second rank mode signal 2Rank and the first chip selection signal CS<0>, a first inverter IV11 inverts the output of the second NAND gate ND12, and a third NAND gate ND13 receives the output of first inverter IV11 and the third combination signal Bank07. A fourth NAND gate ND14 receives the third rank mode signal 4Rank and the first chip selection signal CS<0>, and a second inverter IV12 inverts the output of the fourth NAND gate ND14, and a fifth NAND gate ND15 receives the output of the second inverter IV12 and the third combination signal Bank07. A sixth NAND gate ND16 receives the output of the first NAND gate ND11 and the output of the third NAND gate ND13, and a third inverter IV13 inverts the output of the sixth NAND gate ND16. A seventh NAND gate ND17 receives the output of the third inverter IV13 and the output of the fifth NAND gate ND15. Fourth and fifth inverters IV14 and IV15 sequentially invert the output of the seventh NAND gate ND17 and generate the first power supply enable signal PWR0_en. The second to fourth enable signal generating parts 122-124 may have the same configuration as the first enable signal generating part 121 except that input signals thereto are different.

Through the above-described configuration, the first enable signal generating part 121 enables the first power supply enable signal PWR0_en when the first combination signal Bank03 is enabled, that is, one of the first to fourth bank address signals Bank<0:3> is enabled, in the first rank mode '1Rank mode'. In the second rank mode '2Rank mode', the first enable signal generating part 121 enables the first power supply enable signal PWR0_en when one of the first to eighth bank address signals Bank<0:7> is enabled if the first chip selection signal CS<0> is enabled. In the third rank mode '4Rank mode', the first enable signal generating part 121 enables the first power supply enable signal PWR0_en when one of the first to eighth bank address signals Bank<0:7> is enabled if the first chip selection signal CS<0> is enabled.

The second enable signal generating part 122 enables the second power supply enable signal PWR1_en when the second combination signal Bank47 is enabled, that is, one of the fifth to eighth bank address signals Bank<4:7> is enabled, in the first rank is mode '1Rank mode'. In the second rank mode '2Rank mode', the second enable signal generating part 122 enables the second power supply enable signal PWR1_en when one of the first to eighth bank address signals Bank<0:7> is enabled if the second chip selection signal CS<1> is enabled. In the third rank mode '4Rank mode', the second enable signal generating part 122 enables the second power supply enable signal PWR1_en when one of the first to eighth bank address signals Bank<0:7> is enabled if the second chip selection signal CS<1> is enabled.

The third enable signal generating part 123 enables the third power supply enable signal PWR2_en when the first combination signal Bank03 is enabled, that is, one of the first to fourth bank address signals Bank<0:3> is enabled, in the first rank mode '1Rank mode'. In the second rank mode '2Rank mode', the third enable signal generating part 123 enables the third power supply enable signal PWR2_en when one of the first to eighth bank address signals Bank<0:7> is enabled if the first chip selection signal CS<0> is enabled. In the third rank mode '4Rank mode', the third enable signal generating part 123 enables the third power supply enable signal PWR2_en when one of the first to eighth bank address signals Bank<0:7> is enabled if the third chip selection signal CS<2> is enabled.

The fourth enable signal generating part 124 enables the fourth power supply enable signal PWR3_en when the second combination signal Bank47 is enabled, that is, one of the fifth to eighth bank address signals Bank<4:7> is enabled, in the first rank mode '1Rank mode'. In the second rank mode '2Rank mode', the fourth enable signal generating part 124 enables the fourth power supply enable signal PWR3_en when one of the first to eighth bank address signals Bank<0:7> is enabled if the second chip selection signal CS<1> is enabled. In the third rank mode '4Rank mode', the fourth enable signal generating part 124 enables the fourth power supply enable signal PWR3_en when one of the first to eighth bank address signals Bank<0:7> is enabled if the fourth chip selection signal CS<3> is enabled.

The operations of the power supply control unit 100 can be summarized as in Table 2.

TABLE 2

| 1 Rank | 2 Rank | 4 Rank | CS<0> | CS<1> | CS<2> | CS<3> | Bank03 | Bank47 | PWR 0_en | PWR 0_en | PWR 0_en | PWR 0_en |
|---|---|---|---|---|---|---|---|---|---|---|---|---|
| 1 | * | * | * | * | * | * | 1 | * | 1 | 0 | 1 | 0 |
| 1 | * | * | * | * | * | * | * | 1 | 0 | 1 | 0 | 1 |
| * | 1 | * | 1 | * | * | * | * | * | 1 | 0 | 1 | 0 |
| * | 1 | * | * | 1 | * | * | * | * | 0 | 1 | 0 | 1 |
| * | * | 1 | 1 | * | * | * | * | * | 1 | 0 | 0 | 0 |
| * | * | 1 | * | 1 | * | * | * | * | 0 | 1 | 0 | 0 |
| * | * | 1 | * | * | 1 | * | * | * | 0 | 0 | 1 | 0 |
| * | * | 1 | * | * | * | 1 | * | * | 0 | 0 | 0 | 1 |

When the semiconductor apparatus 1 operates in the first rank mode '1Rank mode', the power supply control unit 100 enables the first to fourth power supply enable signals PWR0_en-PWR3_en based on the bank address signals Bank<0:7>. When the semiconductor apparatus 1 operates in the second rank mode '2Rank mode', the power supply control unit 100 enables the first to fourth power supply enable signals PWR0_en-PWR3_en based on the first and second chip selection signals CS<0:1>. When the semiconductor apparatus 1 operates in the third rank mode '4Rank mode', the power supply control unit 100 enables the first to fourth power supply enable signals PWR0_en-PWR3_en based on the first to fourth chip selection signals CS<0:3>.

Accordingly, in the embodiment of the present invention, when the semiconductor apparatus 1 operates in the first rank mode '1Rank mode', the power supply control unit 100 enables two power supply enable signals based on the bank address signals Bank<0:7>, and accordingly, power is supplied in common to two memory bank regions of each chip of the plurality of chips. When the semiconductor apparatus 1 operates in the second rank mode '2Rank mode', the power supply control unit 100 enables two power supply enable signals based on the first and second chip selection signals CS<0:1>, and accordingly, power is supplied in common to two memory bank regions of each chip of the plurality of chips. When the semiconductor apparatus 1 operates in the third rank mode '4Rank mode', the power supply control unit 100 enables one power supply enable signal based on the first to fourth chip selection signals CS<0:3>, and accordingly, power is supplied in common to one memory bank region of each of the plurality of chips.

Operations of the semiconductor apparatus 1 in accordance with the embodiment of the present invention will be described with to reference to FIGS. 2 to 5. As an example, it is assumed that the third bank address signal Bank<2> is enabled for inputting/outputting data to and from the third memory banks. When the semiconductor apparatus 1 operates in the first rank mode '1Rank mode', the first rank mode signal 1Rank is enabled. Accordingly, the power supply control unit 100 enables the first and third power supply enable signals PWR0_en and PWR2_en, and the first and third power blocks 10 and 30 supply power in response to the first and third power supply enable signals PWR0_en and PWR2_en. Referring to FIG. 4, since the third memory banks are located in the first and third memory bank regions UL1, UR1, UL2 and UR2 in the first rank mode '1Rank mode', they can be supplied with power through the first and third power blocks 10 and 30. Hence, the third memory banks of the plurality of chips are activated by being supplied with power and can be operated for input/output of data.

When the semiconductor apparatus 1 operates in the second rank mode '2Rank mode' and the first rank is to be operated, the second rank mode signal 2Rank and the first chip selection signal CS<0> are enabled. Accordingly, the power supply control unit 100 enables the first and third power supply enable signals PWR0_en and PWR2_en, and the first and third power blocks 10 and 30 supply power to the first and third memory bank regions UL1, UR1, UL2 and UR2 of the plurality of chips in response to the first and third power supply enable signals PWR0_en and PWR2_en. Referring to FIG. 4, the third memory banks of the first rank are located in the first and third memory bank regions UL1 and UR1 of the lower chip in the second rank mode. Hence, the third memory banks which are supplied with power through the first and third power blocks 10 and 30 can be operated for input/output of data.

When the semiconductor apparatus 1 operates in the third is rank mode '4Rank mode' and the second rank is to be operated, the third rank mode signal 4Rank and the second chip selection signal CS<1> are enabled. Accordingly, the power supply control unit 100 enables the second power supply enable signal PWR1_en, and the second power block 20 supplies power to the second memory bank regions DL1 and DL2 of the plurality of chips in response to the second power supply enable signal PWR1_en. Referring to FIG. 4, the third memory bank of the second rank is located in the second memory bank region DL1 of the lower chip in the fourth rank mode. Hence, the third memory bank which is supplied with power through the second power block 20 can be operated for input/output of data.

The present invention provides a method for efficiently supplying power to memory banks which perform data input/output operations, in a semiconductor apparatus in which a plurality of chips are stacked and which operates in a plurality of ranks. Accordingly, the present invention can control the semiconductor apparatus easily, improve power supply efficiency, and reduce unnecessary power consumption.

While a method of assigning chip selection signals and bank address signals to banks is employed in the embodiment of the present invention, a person having ordinary knowledge in the art can appreciate that other signal assignments can be employed and the logic of the power supply control circuit can be freely changed according to these other signal assignments, within the scope and the spirit of the invention.

While certain embodiments have been described above with reference to illustrative examples for particular applications, it will be understood to those skilled in the art that the embodiments described are by way of example only. Those skilled in the art with access to the teachings provided in this disclosure will recognize additional modifications, applications, and/or embodiments and additional fields in which the present disclosure would be of significant utility. Accordingly, the power supply control circuit and the semiconductor apparatus including the same described herein should not be limited based on the described embodiments. Rather, the power supply control circuit and the semiconductor apparatus including the same described herein should only be limited in light of the claims that follow when taken in conjunction with the above description and accompanying drawings.

What is claimed is:

1. A power supply control circuit comprising:
   a power supply control unit configured to receive a rank mode signal and generate a plurality of power supply enable signals based on a rank mode designated by the rank mode signal, chip selection signals and bank address signals; and
   a plurality of power blocks configured to supply power to a plurality of memory banks of a plurality of chips based on the plurality of power supply enable signals.

2. The power supply control circuit according to claim 1, wherein the power supply control unit generates the power supply enable signals based on the bank address signals in a first rank mode.

3. The power supply control circuit according to claim 2, wherein the power supply control unit generates the power supply enable signals based on two of the chip selection signals in a second rank mode.

4. The power supply control circuit according to claim 3, wherein the power supply control unit generates the power supply enable signals based on four of the chip selection signals in a third rank mode.

5. The power supply control circuit according to claim 4, wherein the power supply control unit comprises:
   a signal combining section configured to receive the bank address signals and generate first to third combination signals; and
   a power supply enable signal generating section configured to receive one or more rank mode signals to generate the plurality of power supply enable signals based on a rank mode designated by the rank mode signals, the chip selection signals, and the first to third combination signals.

6. The power supply control circuit according to claim 1, wherein the power is supplied in common to the plurality of memory banks of the plurality of chips through through-silicon vias (TSVs).

7. The power supply control circuit according to claim 1, wherein the power includes internal voltages which are used in operations of the memory banks.

8. A semiconductor apparatus comprising:
   a plurality of chips stacked vertically, wherein each chip has a first to a fourth memory bank region, and each bank region of each chip is placed over or under the respective bank region of the other chips such that each first to fourth bank region is in the same position in its respective plane;
   a power supply control circuit configured to supply power in common to two memory bank regions of each of the plurality of chips in response to bank address signals in a first rank mode, and to supply power in common to two memory bank regions of the plurality of chips in response to chip selection signals in a second rank mode.

9. The semiconductor apparatus according to claim 8, wherein the power supply control circuit is configured to supply the power to one memory bank regions of the four memory bank regions of the plurality of chips in common in response to chip selection signals in a third rank mode.

10. The semiconductor apparatus according to claim 9, wherein two chip selection signals are used in the second rank mode, and four chip selection signals are used in the third rank mode.

11. The semiconductor apparatus according to claim 8, wherein the power supply control circuit supplies the power to the memory bank regions of the plurality of chips through through-silicon vias (TSVs).

12. The semiconductor apparatus according to claim 8, wherein the power includes internal voltages which are used in operations of memory banks constituting the memory bank regions.

13. The semiconductor apparatus according to claim 9, wherein the power supply control circuit comprises:
   a power supply control unit configured to receive a rank mode signal to generate a plurality of power supply enable signals based on a rank mode from the rank mode signal, the chip selection signals and the bank address signals; and
   a plurality of power blocks configured to supply the power based on the plurality of power supply enable signals.

14. The semiconductor apparatus according to claim 13, wherein the power supply control unit comprises:
   a signal combining section configured to combine the bank address signals and generate first to third combination signals; and
   a power supply enable signal generating section configured to generate the plurality of power supply enable signals based on the rank mode, the chip selection signals, and the first to third combination signals.

15. A semiconductor apparatus comprising:
   a plurality of chips stacked vertically, wherein each chip has first to Nth memory bank regions, wherein N is an integer greater than 1, and each bank region of each chip is placed over or under the respective bank region of the other chips such that each of first to Nth memory bank region is in the same position in its respective plane; and a power supply control circuit configured to supply power to the memory bank regions of the plurality of chips based on the rank mode, chip selection signals and bank address signals, wherein the memory bank regions of the plurality of chips are assigned to different bank address signals based on the rank mode.

16. The semiconductor apparatus according to claim 15, wherein the power supply control circuit supplies power to the memory bank regions of the plurality of chips based on the bank address signals in a first rank mode.

17. The semiconductor apparatus according to claim 16, wherein the power supply control circuit supplies power to the memory bank regions of the plurality of chips based on the chip selection signals in a second rank mode.

18. The semiconductor apparatus according to claim 17, wherein the power supply control circuit supplies power to the memory bank regions of the plurality of chips based on the chip selection signals in a third rank mode.

19. The semiconductor apparatus according to claim 15, wherein the power supply control circuit supplies the power to the memory bank regions of the plurality of chips through through-silicon vias (TSVs).

20. The semiconductor apparatus according to claim 15, wherein the power includes internal voltages which are used in operations of memory banks constituting the memory bank regions.

* * * * *